United States Patent [19]
Ohtake et al.

[11] Patent Number: 5,258,667
[45] Date of Patent: Nov. 2, 1993

[54] LOGIC CIRCUIT FOR CONTROLLING A SUPPLY ON DRIVE PULSES TO REGULATE AN OUTPUT LEVEL

[75] Inventors: Toshikazu Ohtake; Hideaki Yamada, both of Kanagawa, Japan

[73] Assignee: NEC Corporation, Tokyo, Japan

[21] Appl. No.: 832,731

[22] Filed: Feb. 7, 1992

[30] Foreign Application Priority Data

Feb. 8, 1991 [JP] Japan .................................. 3-018055
Jun. 10, 1991 [JP] Japan .................................. 3-137334

[51] Int. Cl.$^5$ .......................................... H03K 19/013
[52] U.S. Cl. .................................. 307/455; 307/443; 307/246
[58] Field of Search ................. 307/443, 446, 454–456, 307/475, 246

[56] References Cited

U.S. PATENT DOCUMENTS

| | | | |
|---|---|---|---|
| 4,678,942 | 7/1987 | Kanai et al. ......................... | 307/455 |
| 4,687,953 | 8/1987 | Varadarajan .................... | 307/443 X |
| 4,928,025 | 5/1990 | Kokado .............................. | 307/455 |
| 4,948,991 | 8/1990 | Schucker et al. ............... | 307/443 X |
| 5,101,124 | 3/1992 | Estrada ........................... | 307/456 X |
| 5,118,973 | 6/1992 | Sakai et al. ..................... | 307/456 X |

*Primary Examiner*—David R. Hudspeth
*Attorney, Agent, or Firm*—Laff, Whitesel, Conte & Saret

[57] ABSTRACT

A logic circuit has means for controlling an active pull-down circuit in response to a detected result of an output level detection circuit. This prevents an undershoot of the output. Accordingly, it is possible to prevent malfunctions of a logic circuit in the next stage. It also prevents a prolongation of the transition time at the time of a rise of the output potential. Moreover, it reduces the power consumption of the circuit as a whole by decreasing a wasteful current from the output transistor of the emitter-follower to the active transistor.

8 Claims, 2 Drawing Sheets

LOGIC CIRCUIT FOR CONTROLLING A SUPPLY ON DRIVE PULSES TO REGULATE AN OUTPUT LEVEL

BACKGROUND OF THE INVENTION

1. Field of the Invention

The present invention relates to a logic circuit, and more particularly to a logic circuit which is provided with an active pull-down circuit for the purpose of reducing the transition time from a high level to a low level of the output of an emitter-follower circuit.

2. Description of the Prior Art

In order to drive a load an emitter-follower circuit is used in general as the output stage of an ECL circuit or the like. In such a case, the emitter-follower circuit is biased using a static current source. When a driving signal is switched from a low level to a high level, the emitter-follower circuit pulls up the output to the high level. The switching speed at this time is proportional to the current that flows in the transistor. On the contrary, when the logic level is switched from the high level to the low level, the pull-down to the low level is accomplished through the drawing of the relevant current by the static current source.

In such an output stage, the probability for the appearance of a malfunction is increased because of the difference in the switching times at the rise and at the fall of the output. For this reason, the transition time from the high level to the low level of the output has generally been reduced by providing the emitter-follower circuit with an active pull-down circuit.

In a logic circuit having an emitter-follower circuit provided with the conventional pull-down circuit, the transition time in the fall of the output will be smaller for greater sinking power of the active pull-down circuit. However, if the load capacitance connected to the output terminal is too small for the sinking power of the pull-down circuit in this case, the undershoot at the time of transition of the output level becomes large. As a result, there arise such problems as causing malfunctions in the logic circuit in the next stage and a prolongation of the transition time from the low level to the high level of the output as well as other problem such as a wasteful flow of current via the active pull-down circuit even after the exhaustive discharge of the electric charge on the load capacitor that is connected to the output terminal owing to the large sinking power of the pull-down circuit, resulting in an increase in the power consumption of the circuit as a whole.

BRIEF SUMMARY OF THE INVENTION

Objects of the Invention

Accordingly, it is an object of the invention to enable to prevent the malfunction by suppressing the undershoot that may occur at the time of the fall of the output potential, and to preclude the prolongation of the transition time at the rise of the output potential, in a logic circuit having an emitter-follower equipped with an active pull-down circuit.

Further, it is another object of the invention to reduce the power consumption of the circuit as a whole by preventing a wasteful current flow via the active pull-down circuit.

SUMMARY OF THE INVENTION

The logic circuit according to the invention comprises an emitter-follower circuit, an active pull-down circuit which pulls down the potential at the output end of the emitter-follower circuit in response to the changes in the input level of the emitter-follower circuit, an output level detection circuit which detects the change from the high level to the low level of the potential of the output end of the emitter-follower circuit, and control means which controls the energization of the active pull-down circuit in response to the detected result of the output level detection circuit.

The active pull-down circuit includes first switching means provided between the output end of the emitter-follower circuit and a first power supply, and its switching is controlled in response to a control signal from the control circuit.

The output level detection circuit includes second switching means the energization thereof is controlled in response to the potential of the output end of the emitter-follower circuit provided between the input of the active pull-down circuit and a second power supply, and means for generating a detected signal in response to the output of the second switching means.

The control means is provided between the output end of the emitter-follower circuit and the first power supply, and includes third switching means the energization thereof being controlled in response to the detected signal.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Figure 1:
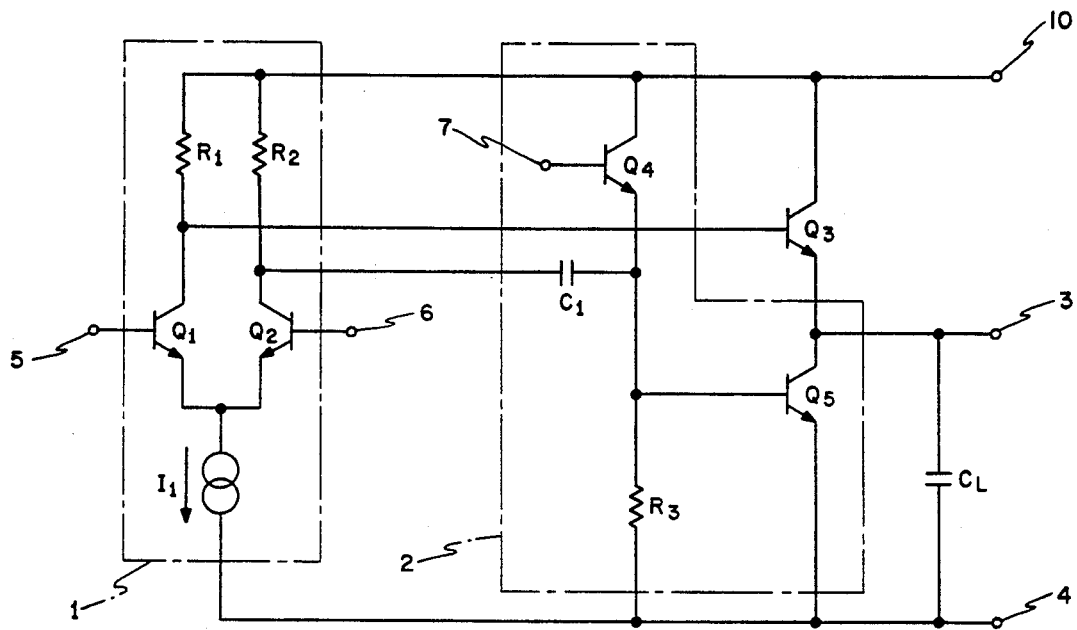
FIG. 1 is a circuit diagram showing a logic circuit having an emitter-follower equipped with conventional active pull-down circuit.

Prior to proceeding to the description of the embodiments of the invention, an explanation about the problems to be resolved by this invention is in order. Heretofore, it has been general, for example, to provide an active pull-down circuit in an emitter-follower circuit used as the output stage of a logic circuit in order to reduce the transition time from the high level to the low level of the output of the logic circuit. As an example of the above-mentioned type of logic circuits, an inverter circuit is shown in FIG. 1. This inverter is constituted of a differential circuit 1 that includes NPN transistors $Q_1$ and $Q_2$ that form a differential pair, and an active pull-down (APD) circuit 2 which includes an NPN transistor $Q_3$ that constitutes an output stage, NPN transistors $Q_4$ and $Q_5$, a capacitor $C_1$, and a resistor $R_3$. A capacitor $C_L$ provided between an output terminal 3 and a power terminal ($-3.3$ to $-5$ V) shows the capacitor as a load in the output terminal. Here, the capacitor $C_1$, the NPN transistor $Q_4$, and the resistor $R_3$ in the APD circuit are for controlling the base current of the active transistor $Q_5$ at the time when the output is in a steady state. The discharging power with respect to the load capacitor $C_L$ is higher for larger base current of the active transistor $Q_5$.

Next, the operation of this circuit will be described. It will be assumed here that a potential of $-1.1$ V is applied to a reference potential terminal 6, and a constant potential of $-1.6$ V is applied to another reference potential terminal 7.

First, as the potential of an input terminal 5 becomes lower level (for example, $-1.4$ V) than that of the potential ($-1.1$ V) of the reference potential terminal 6, the NPN transistor $Q_1$ goes to an off-stage, and its collector potential is raised up to the grounding potential. As a result, a high level potential (about $-0.8$ V) which is lower from the grounding potential by the voltage between the base and the emitter of the NPN transistor $Q_3$ the base thereof is connected to the collector of the NPN transistor $Q_1$, is generated at the output terminal 3.

When the level of the input terminal 5 is inverted from the low level to the high level at this point, the NPN transistor $Q_1$ goes to an on-state and the NPN transistor $Q_2$ goes to an off-state. Because of this, the collector voltage of the NPN transistor $Q_1$ becomes to have a potential (about $-0.6$ V) which is obtained by subtracting the potential drop due to a resistor $R_1$ and a constant current $I_1$ from the grounding potential. Accordingly, a low level potential ($-1.4$ V) which is further lower by the potential between the base and the emitter of the NPN transistor $Q_3$ is generated in the output terminal 3. At this time, the APD circuit performs the following operation. Namely, as the level of the input terminal 5 is inverted from the low level to the high level, the NPN transistor $Q_2$ of the differential pair 1 goes to an off-state, so that the collector voltage of $Q_2$ makes a transition from the low level to the high level. Then, a charging current flows transitionally in the base of the NPN transistor $Q_5$ through the capacitor $C_1$, and $Q_5$ goes to the on-state. Because of this, the electrical charge on the load capacitor $C_L$ connected to the output terminal 3 is quickly discharged.

As described in the above, in the inverter circuit 1 shown in FIG. 1, it is possible to reduce the transition time of the fall of the output by the provision of the APD circuit 2. In particular, the discharging power with respect to the load capacitor $C_1$ can be made higher for stronger sinking power of the active transistor $Q_5$ that constitutes the APD circuit.

However, if the load capacitor connected to the output terminal is smaller for the sinking power of the active transistor, the electric charge of the load capacitor is discharged quickly, causing a phenomenon, namely, an undershoot, in which the potential of the output terminal drops instantaneously beyond a predetermined value. As a result, there may be caused malfunctions in the next stage logic circuit or prolongation of the transition time from the low level to the high level of the output.

Moreover, there arises a problem of increasing the power consumption of the circuit as a whole because of the flow of a wasteful current in the active transistor $Q_5$ via the emitter-follower transistor $Q_3$ even after the complete discharge of the electric charge of the load capacitor because of the large sinking power of the active transistor.

Figure 2:
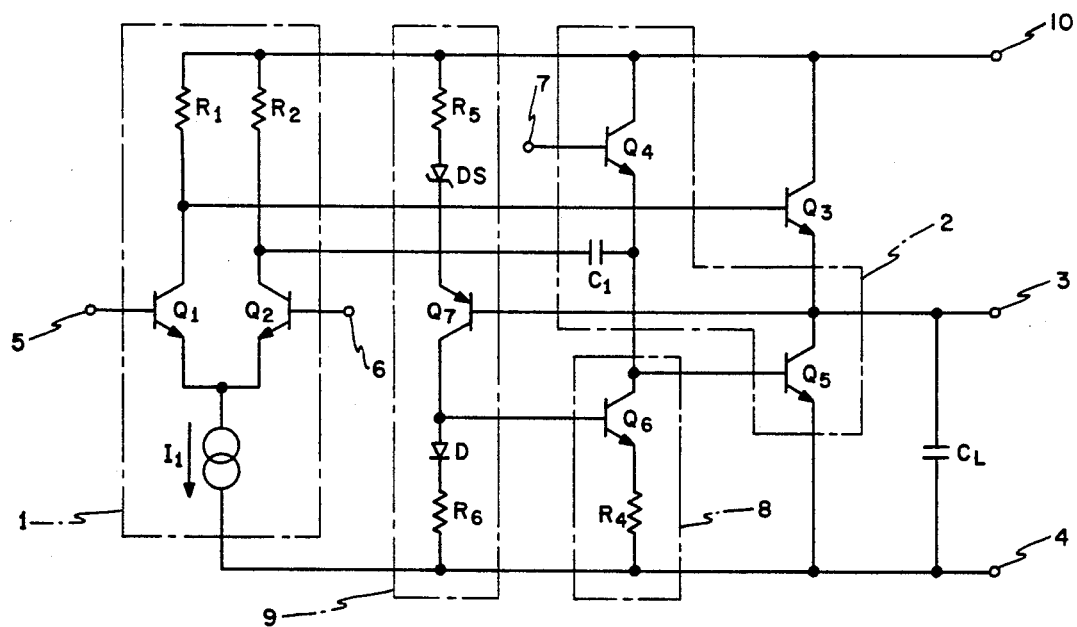
FIG. 2 is a circuit diagram showing a logic circuit having an emitter-follower circuit equipped with an active pull-down circuit which is a first embodiment according to the invention.

Next, referring to FIG. 2, the first embodiment of the invention will be described. In FIG. 2, the components that are the same as those in FIG. 1 are assigned the same reference numerals. The structural differences from FIG. 1 are the following two points. First, a base potential control circuit 8 is provided in place of the resistor $R_3$ that determines the potential between the base and the emitter of the active transistor $Q_5$, and, second, there is provided an output level detection circuit 9.

The base potential control circuit 8 is constructed by serially connecting an NPN transistor $Q_6$ and a resistor $R_4$ between the base of the active transistor $Q_5$ and the power terminal 4, and connecting the collector of the NPN transistor $Q_6$ and the base of the NPN transistor $Q_5$.

The output level detection circuit 9 is constituted of a resistor $R_5$, a diode DS, a PNP transistor $Q_7$, a resistor $R_6$, and a diode D for making the resistance of $R_6$ small, connected in series between the power terminal 4 and the grounding terminal 10. The PNP transistor $Q_7$ has its base connected to the output terminal 3, and its collector connected to the base of the NPN transistor $Q_6$ of the base potential control circuit 8.

The remainder of the constitution is similar to that of FIG. 1 so that detailed structural description of the embodiment will be omitted.

Next, the operation of this embodiment will be described. It will be assumed that a potential of $-1.1$ V is applied to the reference potential terminal 6, and a constant potential of $-1.6$ V is applied to the reference potential terminal 7.

First, when the input terminal 5 has a lower level (for example, $-1.4$ V) than the potential ($-1.1$ V) of the reference potential terminal 6, the NPN transistor $Q_1$ goes to the off-state, and a potential of high level is generated in the output terminal 3 similar to the case of FIG. 1. As a result, the bias between the base and the emitter of the PNP transistor $Q_7$ of the output level detection circuit 9 goes to a state (with the collector current of about 1 $\mu$A and the forward voltage between the base and the emitter of about 0.7 V) in which the NPN transistor $Q_6$ of the base potential control circuit 8 is slightly biased in the forward direction, and a base current (about 1 $\mu$A) comparable to that in the conventional circuit shown in FIG. 1 flows in the base of the active transistor $Q_5$.

Next, as the level of the input terminal 5 is inverted from the low level to the high level the NPN transistor $Q_1$ is turned on, and a low level potential is generated at the output terminal 3 same as in the prior art as shown in FIG. 1. At this time, a charging current transitionally flows into the base of the NPN transistor $Q_5$ through the capacitor $C_1$ and $Q_5$ goes to the on-state, so that the electric charge of the load capacitor $C_L$ connected to the output terminal 3 is discharged.

The circuit operation described in the above is similar to that in the conventional circuit. In this embodiment, however, at the same time with the above-mentioned operation, the PNP transistor $Q_7$ of the output level detection circuit is turned on more deeply biased in the forward direction because of the going of the output terminal 3 to the low level, increasing its collector current. Then, the base potential of the NPN transistor $Q_6$ of the base potential detection circuit 8 is raised accompanying this increase in the collector current, and $Q_6$ is turned on. As a result, the excess component of the base current that drives the active transistor $Q_5$ is drawn from the collector of the NPN transistor $Q_6$, enabling the prevention of the undershoot of the output. Accordingly, it is possible to prevent malfunctions of the logic circuit in the next stage, and to prevent the prolongation of the transition time at the rise of the output potential. Moreover, it is possible to reduce a wasteful current from the output transistor of the emitter-follower to the active transistor, and to reduce the power consumption of the circuit as a whole.

Figure 3:
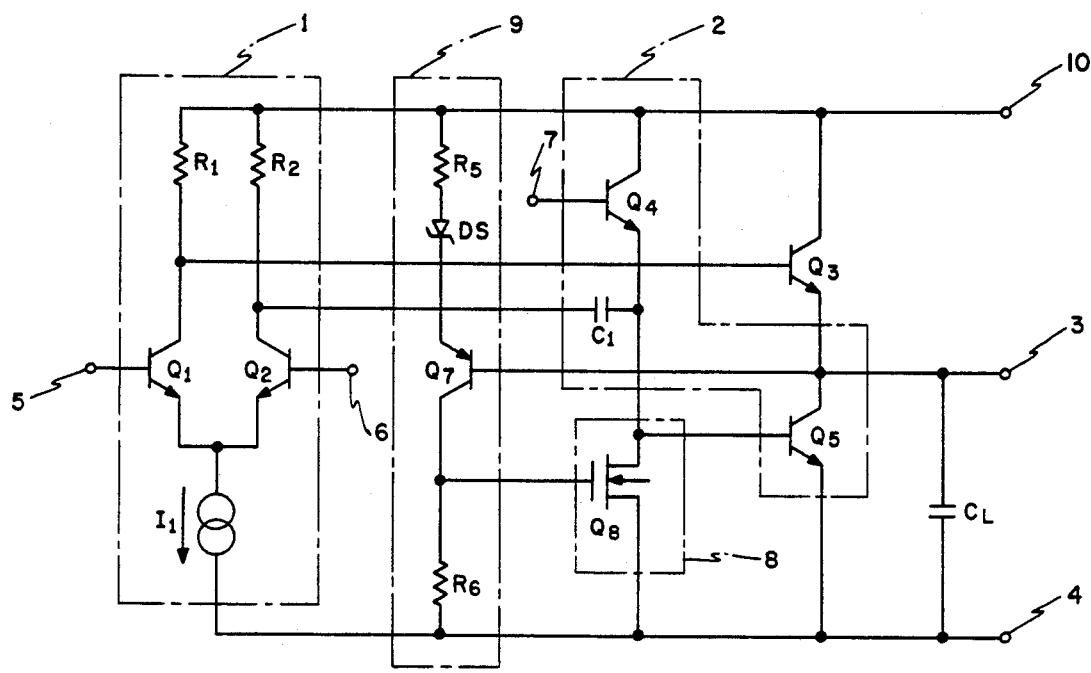
FIG. 3 is a circuit diagram showing a logic circuit which is a second embodiment according to the invention.

Next, referring to FIG. 3, the second embodiment of the invention will be described. The constitutional difference between this embodiment and the first embodiment shown in FIG. 2 consist in the replacement of the NPN transistor $Q_6$ and the resistor $R_4$ of the base potential control circuit 8 by an N-channel type MOS transistor $Q_8$, and deleted the diode D of the output level detection circuit 9 which becomes unnecessary due to adoption of the MOS transistor. Since the remainder of the constitution is the same as that of the first embodiment shown in FIG. 2, detailed description will be omitted.

In the circuit operation of this embodiment, the MOS transistor $Q_8$, instead of the NPN transistor $Q_6$, is turned on, and the excess component of the base current that drives the active transistor $Q_5$ is drawn by this MOS transistor $Q_8$. As a result, it is possible to prevent the undershoot of the output similar to the first embodiment. The remaining operation is analogous to that of the first embodiment.

Figure 4:
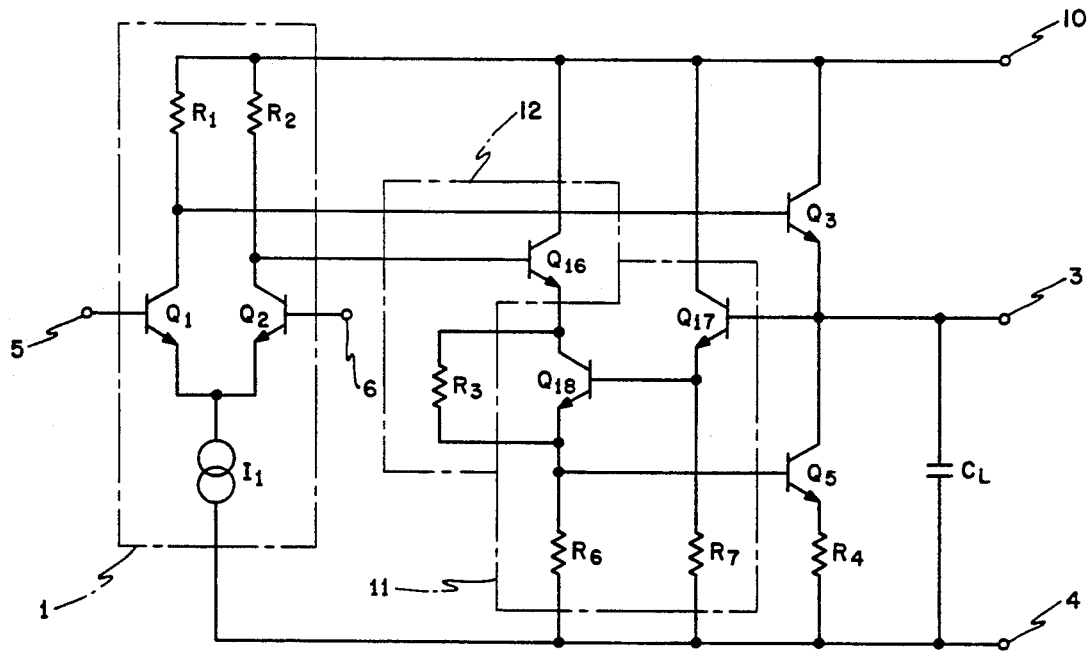
FIG. 4 is a circuit diagram showing a logic circuit which is a third embodiment according to the invention.

Next, referring to FIG. 4, the third embodiment of the invention will be described. The constitutional difference between this embodiment and the first embodiment shown in FIG. 5 consists in the following points. Namely, an output level detection circuit 11 which feeds back the potential of the output terminal 3 when the input terminal 5 is at the low level is constituted of NPN transistors $Q_{17}$ and $Q_{18}$ and resistors $R_6$ and $R_7$, and that a base potential control circuit 12 of the active transistor $Q_5$ is constituted of an NPN transistor $Q_{16}$ and a resistor $R_3$. Since the remaining constitution is the same as that of the first embodiment shown in FIG. 2, detailed description of this embodiment will be omitted.

Next, the circuit operation of the embodiment will be described. When the input terminal 5 goes to a level lower than that of the potential of the reference potential terminal 6, the NPN transistor $Q_1$ goes to the off-state, and a high level potential is generated at the output terminal 3. As a result, the NPN transistors $Q_{17}$ and $Q_{18}$ of the output level detection circuit 11 are forwardly biased, and a base current of the same order as that in the conventional circuit shown in FIG. 1 flows in the base of the active transistor $Q_5$.

Next, as the level of the input terminal 5 is inverted from the low level to the high level, the NPN transistor $Q_2$ goes to the off-state, and the collector potential of $Q_2$, namely, the base potential of the transistor $Q_{16}$ goes from the low level to the high level. Therefore, the emitter current of the transistor $Q_{16}$ flows into the resistor $R_6$ via the transistor $Q_{18}$. Since the base potential of the transistor $Q_5$ is raised due to the emitter current of the transistor $Q_{16}$, $Q_5$ acts to draw the current of the load capacitor $C_L$.

Next, when the electric charge of the load capacitor $C_L$ is completely drained and the potential of the output terminal 3 goes to the low level, the emitter potential of the transistor $Q_{17}$ of the output level detection circuit 11 falls causing the transistor $Q_{18}$ to go to the off-state. At this time, the base potential of the transistor $Q_5$ is supplied by the emitter current of the transistor $Q_{16}$ via the resistor $R_3$, and the base current becomes comparable to that when the input terminal 5 is at the low level. Accordingly, this embodiment can also prevent the undershoot of the output analogous to the first and the second embodiments.

Although the invention has been described in the above-mentioned embodiments by using the ECL circuit as an example, the invention is not limited to that case alone and it can be applied to any logic circuit as long as it has an emitter-follower circuit equipped with an active pull-down circuit.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modification or embodiment as falls within the true scope of the intention.

We claim:

1. A logic circuit comprising an emitter-follower circuit, an active pull-down circuit which pulls down the potential of the output of said emitter-follower circuit in response to the change in the input level of said emitter-follower circuit, an output level detection circuit which detects a change in the potential of the output end of said emitter-follower circuit from a high level to a low level, control means for controlling an energization of said active pull-down circuit in response to the detected result of said output level detection circuit, said output detection circuit including first switching means provided between an output of said output level detection circuit and a first power supply, and means for generating a detection signal in response to the output of said first switching means, the energization of said first switching means being controlled in response to a potential level at an output end of said emitter-follower circuit, said control means being provided between the input end of said active pull-down circuit and a second power supply and including second switching means, the energization of said second switching means being controlled in response to said detection signal.

2. A logic circuit as claimed in claim 1, wherein said active pull-down circuit includes third switching means provided between the output end of said emitter-follower circuit and said second power supply, and the switching of said third switching means being controlled in response to the change in the input level of said emitter-follower circuit and further to an output of said third switching means.

3. A logic circuit as claimed in claim 1, wherein said second switching means is a bipolar transistor.

4. A logic circuit as claimed in claim 1, wherein said second switching means is an MOS transistor.

5. A logic circuit comprising an output stage transistor having a collector connected to a first power supply, said output stage transistor having an emitter connected to an output terminal, and said output stage transistor having a base connected to an input terminal, an active transistor connected between said output terminal and a second power supply, the energization of said active transistor being controlled in response to a control signal, and control means for detecting a potential change at said output terminal and generating said control signal in response to the detected result, said control means including first switching means provided between the output of said control means and said first power supply, and second switching means provided between said output terminal and said second power supply, the energization of said first switching means being controlled in response to the potential of said output terminal, and the switching of said second switching means being controlled in response to the output of said first switching means.

6. A logic circuit comprising a first transistor having a control electrode and being connected between a first power terminal and an output terminal, a second transistor having a control electrode and being connected between said output terminal and a second power terminal, a drive circuit coupled to the control electrodes of said first and second transistors, said drive circuit being responsive to an input signal for supplying a first drive signal to the control electrode of said first transistor to cause said first transistor to charge said output terminal when said input signal takes a first logic level and for supplying a second drive signal to the control electrode of said second transistor to cause said second transistor to discharge said output terminal when said input signal takes a second logic level, a third transistor having a control electrode and being connected between the control electrode of said second transistor and said second power terminal, and an output level detection circuit coupled to said output terminal and the control electrode of said third transistor and operating responsive to detected levels for discharging said second transistor for driving said third transistor so that said third transistor suppresses the supply of said second drive signal from said drive circuit to the control electrode of said second transistor in order to lower the energization of said second transistor.

7. The logic circuit as claimed in claim 6, wherein said output level detection circuit includes a bias resistor connected between the control electrode of said third transistor and said second power terminal and a fourth transistor connected between the control electrode of said third transistor and said first power terminal and having a control electrode coupled to said output terminal.

8. The logic circuit as claimed in claim 7, wherein each of said first, second and third transistors has a first conductivity type and said fourth transistor has a second conductivity type which is opposite to said first conductivity type.

* * * * *